United States Patent
Kluge et al.

(10) Patent No.: US 11,205,805 B2
(45) Date of Patent: Dec. 21, 2021

(54) TEST DEVICE FOR AN ELECTROCHEMICAL CELL, MODULE COMPRISING A TEST DEVICE, AND METHOD FOR TESTING AN ELECTROCHEMICAL CELL

(71) Applicant: Bayerische Motoren Werke Aktiengesellschaft, Munich (DE)

(72) Inventors: Juliane Kluge, Munich (DE); Simon Lux, Munich (DE); Sebastian Scharner, Tuerkenfeld (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 0 days.

(21) Appl. No.: 16/962,551

(22) PCT Filed: Jan. 17, 2019

(86) PCT No.: PCT/EP2019/051126
§ 371 (c)(1),
(2) Date: Jul. 16, 2020

(87) PCT Pub. No.: WO2019/141764
PCT Pub. Date: Jul. 25, 2019

(65) Prior Publication Data
US 2020/0411915 A1 Dec. 31, 2020

(30) Foreign Application Priority Data
Jan. 18, 2018 (DE) ...................... 10 2018 200 796.9

(51) Int. Cl.
*H01M 10/42* (2006.01)
*G01R 31/396* (2019.01)
(Continued)

(52) U.S. Cl.
CPC ...... *H01M 10/4285* (2013.01); *G01R 31/396* (2019.01); *H01M 10/48* (2013.01); *H05B 6/36* (2013.01)

(58) Field of Classification Search
USPC ............. 324/415, 437, 425–433, 76.11, 126, 324/756.05, 538, 200, 207.13, 233, 256,
(Continued)

(56) References Cited

U.S. PATENT DOCUMENTS

| | | | |
|---|---|---|---|
| 5,939,217 A | 8/1999 | Tamura et al. | |
| 2004/0004464 A1* | 1/2004 | Tsukamoto | H01M 10/623 320/162 |

(Continued)

FOREIGN PATENT DOCUMENTS

| | | |
|---|---|---|
| EP | 2 642 582 A2 | 9/2013 |
| JP | 2014-22283 A | 2/2014 |
| WO | WO 2012/057752 A1 | 5/2012 |

OTHER PUBLICATIONS

International Search Report (PCT/ISA/210) issued in PCT Application No. PCT/EP2019/051126 dated Apr. 30, 2019 with English translation (five (5) pages).

(Continued)

*Primary Examiner* — Douglas X Rodriguez
*Assistant Examiner* — Trung Q Nguyen
(74) *Attorney, Agent, or Firm* — Crowell & Moring LLP

(57) ABSTRACT

A test device for an electrochemical cell is arranged inside the electrochemical cell in such a way that it is in electrical contact with two current-carrying electrodes of the electrochemical cell. The test device includes a switching device having at least one cathode and one anode partial electrode which are adjacently arranged, but with a space thereinbetween. In an initial state, the switching device is opened such that electrical current cannot flow between the partial elec- (Continued)

trodes. The switching device is closed in a short-circuit state by bridging the space between the partial electrodes such that an electrical current can flow between the current-carrying electrodes of the electrochemical cell and through the partial electrodes.

13 Claims, 5 Drawing Sheets

(51) Int. Cl.
*H01M 10/48* (2006.01)
*H05B 6/36* (2006.01)

(58) Field of Classification Search
USPC .......................... 324/515, 500–530, 750.06
See application file for complete search history.

(56) References Cited

U.S. PATENT DOCUMENTS

| | | |
|---|---|---|
| 2013/0209841 A1* | 8/2013 | Keyser .............. H01M 10/4285 |
| | | 429/50 |
| 2013/0252039 A1 | 9/2013 | Vom Dorp et al. |
| 2016/0005562 A1 | 1/2016 | Yoneda |
| 2016/0268646 A1* | 9/2016 | Wang .................. H01M 10/443 |
| 2017/0133872 A1* | 5/2017 | Masuda ................ H02J 7/0063 |

OTHER PUBLICATIONS

German-language Written Opinion (PCT/ISA/237) issued in PCT Application No. PCT/EP2019/051126 dated Apr. 30, 2019 (five (5) pages).

German-language Search Report issued in German Application No. 10 2018 200 796.9 dated Sep. 4, 2018 with partial English translation (17 pages).

* cited by examiner

TEST DEVICE FOR AN ELECTROCHEMICAL CELL, MODULE COMPRISING A TEST DEVICE, AND METHOD FOR TESTING AN ELECTROCHEMICAL CELL

BACKGROUND AND SUMMARY OF THE INVENTION

The invention relates to a test device for an electrochemical cell, a module comprising a test device, and also a method for testing an electrochemical cell.

Electrochemical cells are used in diverse applications as energy stores, inter alia in the form of lithium-ion rechargeable batteries. A plurality of electrochemical cells are often combined to form a module, which is then installed for example as an energy store in a vehicle.

In order that a defect of an electrochemical cell, in particular damage that causes an internal short circuit in the cell, does not result in damage in the surroundings of the cell, safeguard measures of a known type are implemented.

One known test attempts to bring the electrochemical cell to thermal runaway, in the case of which a local short circuit of the internal electrodes results in a local large temperature increase inside the cell. This often has the consequence of the electrochemical cell being destroyed on account of the inherent acceleration of electrochemical reactions at higher temperatures.

In order to test the behavior of an electromagnetic cell under controlled conditions, it is necessary to be able to bring about e.g. an internal short circuit in an electrochemical cell in a targeted manner, preferably even when said electrochemical cell is installed within a module.

It is an object of the invention to provide a test device and a module, and also a test method, with which an internal short circuit with predefined properties can be produced in an electrochemical cell in a targeted manner for test purposes.

In order to achieve this object, a test device is provided. This test device for an electrochemical cell is arranged inside the electrochemical cell and has a switching device electrically connected to two current-carrying electrodes of the electrochemical cell having different polarities. The switching device has at least one cathodic and one anodic partial electrode arranged adjacently, but with a space therebetween, wherein the switching device is open in an initial state, such that no electric current can flow between the partial electrodes, and the switching device is closed in a short-circuit state in which the space between the partial electrodes is bridged, such that an electric current can flow between the current-carrying electrodes of the electrochemical cell and through the partial electrodes.

When the test device is triggered, the switching device is transferred to its short-circuit state and a short circuit is thus produced inside the electrochemical cell in a targeted manner, on the basis of which short circuit the behavior of the electrochemical cell and optionally the efficacy of the safeguard systems provided can be checked.

Besides the reproducibility of the production of the short circuit that is afforded by the use of the switching device, it is also advantageous that the resistance of the switching device in the short-circuit state is known exactly, such that it is possible to detect the current flow inside the electrochemical cell in the short-circuit state.

For test purposes, individual electrochemical cells or subcells inside an electrochemical cell are prepared. As a result of the test device being triggered, a short circuit is then brought about in a targeted manner in the prepared cell(s) by establishing an electrical connection between the current-carrying electrodes. In this case, it is possible to observe the reaction of the cell under test conditions.

The switching device should be designed such that fast and safe closing of a short-circuiting circuit is possible. By contrast, opening of the switching device and interruption of the short-circuiting circuit need not be provided.

Preferably, it is possible to maintain the current flow by way of the switching device in the short-circuit state until conditions for thermal runaway prevail in the cell or, correspondingly, until it is ensured that thermal runaway is prevented by the incorporated safeguard devices.

The switching device is advantageously constructed as simply as possible to enable reliable closing. At the same time, it should be fashioned robustly enough that it can withstand the short-circuit current of an electrochemical cell, which can be several 100 to several 1000 A, over the desired time duration up to a few seconds.

In one preferred embodiment, the switching device comprises an electrically conductive contact substance, which is kept at a distance from at least one of the partial electrodes by a gap in the initial state, wherein the contact substance is arranged such that upon transition to the short-circuit state, under the influence of gravity, it passes into the interspace between two adjacent partial electrodes and bridges said interspace and thus closes the switching device. A complex switching mechanism can thus be avoided; it is merely necessary to release the contact substance from a carrier, whereupon it automatically falls into the interspace between the partial electrodes and mechanically bridges the interspace between the partial electrodes in order to close the short-circuiting circuit.

Preferably, in the initial state the contact substance is at a distance from all the partial electrodes and suspended e.g. above a pair of electrodes. However, it would also be conceivable to fix the contact substance to one of the partial electrodes such that when the switching device is triggered, on account of gravity, said contact substance bridges the interspace to an adjacent partial electrode of the opposite polarity.

In this case, with regard to its electrical conductivity and also with regard to its mass, the contact substance should be chosen, of course, such that, in the short-circuit state, it sufficiently fills the interspace between two adjacent partial electrodes having different polarities and the expected quantity of current under short-circuit conditions can reliably flow through the contact substance from one partial electrode to the other. The contact substance should therefore have the lowest possible electrical resistance and a sufficiently large volume.

The contact substance can be chosen as desired, for example in the form of a single solid body or a multiplicity of solid bodies. The contact substance can also be formed by an electrically conductive liquid.

In one preferred embodiment, the contact substance consists of a material which is in the solid state of matter in the initial state and in the liquid state of matter in the short-circuit state. In this case, secure fixing is possible in the initial state by virtue of the fact that the contact substance can be retained as a solid body, and it is also possible to fill the interspace with low electrical resistance at the contact points between the contact substance and the partial electrodes since at this moment the contact substance flows as a liquid into the interspace and thus forms an areal electrical contact with the partial electrodes.

In the initial state the switching device is normally at a temperature below the melting point of the contact substance.

In this case, the switching device is closed by action of heat on the contact substance, whereupon the latter liquefies and drips into the interspace between the partial electrodes.

Preferably, the contact substance has a melting point of approximately 50 to 100° C., which allows simple handling.

A material having such a melting point is found for example among the alloys containing at least 30% bismuth and also lead, tin, indium and/or cadmium. Known examples of such alloys are Wood's metal, Rose's metal, Field's metal, Cerrolow 136 or Cerrosafe.

In the switching device, by way of example, a piece of such a material as contact substance can be adhesively bonded fixedly above the partial electrodes in the initial state, or a carrier, for example composed of an electrically nonconductive plastic, can be embedded into the contact substance as suspension. In this way, the contact substance can be arranged simply in such a way that the material, upon melting, drips or falls into the interspace between the partial electrodes in a manner governed by gravity.

In another variant, it would be possible to use such a material in a triggering device that releases the actual contact substance by liquefaction when the melting point is exceeded. The contact substance could then be a solid body composed of a highly conductive metal having a higher melting point which is adhesively bonded fixedly to the material having a low melting point, for example. It would also be conceivable for a pressurized container containing an electrically conductive liquid to be closed by such a material having a low melting point.

By way of example, the switching device comprises at least one cathodic and at least one anodic partial electrode which are arranged next to one another in a horizontally oriented plane and are separated by an interspace. Advantageously, the contact substance in the initial state is positioned above the partial electrodes.

The switching device can be surrounded by a closed, electrically insulating enclosure or a housing. The contact substance in the initial state can also be fixed to this. Said housing can also serve to keep the contact substance in the liquid state in the interspace between the partial electrodes.

Moreover, the housing can be utilized for the electrical contacting of the partial electrodes. Preferably, all anodic partial electrodes are connected to a first connecting cable and all cathodic partial electrodes are connected to a second, separate connecting cable, which second connecting cable is electrically insulated from the first connecting cable.

The electrical connections to the individual partial electrodes can be routed externally along the housing. These electrode connections between anodic and respectively cathodic partial electrodes can be routed in planes which lie one above another and which are separated from one another e.g. by an electrically insulating film.

The connecting cables and also the electrode connectors preferably comprise the same material as the respective partial electrodes. These materials, e.g. aluminum and copper, advantageously correspond to the materials of the respective current-carrying electrodes or cell-internal current collectors to which the test device is intended to be connected by means of the connecting cables.

In one preferred embodiment, the partial electrodes of the switching device form an electrode cage and the contact substance in the initial state is positioned within the electrode cage. Preferably, the electrode cage is embodied such that independently of an orientation in space, upon transition to the short-circuit state, the contact substance passes into the interspace between a cathodic and an anodic partial electrode and bridges said interspace.

By way of example, eight partial electrodes of one polarity can be arranged in the corners of a cube, while six partial electrodes of the other polarity are positioned on the side faces of the cube. In this case, all the partial electrodes are spaced apart from one another by interspaces. The contact substance can be suspended in the center of the electrode cage between the partial electrodes of the side faces. The partial electrodes on the side faces are preferably embodied in an elevated fashion and can advantageously have the shape of a pyramid or a cone, while the partial electrodes in the corners of the cube can be made tetrahedral and positioned such that a respective face of the tetrahedron obliquely truncates a corner of the cube.

Upon the triggering of the switching device and the transition to the short-circuit state, the contact substance is then released from its fixing and falls into the interspace between a cathodic and an anodic partial electrode, said interspace being situated below the contact substance precisely in a vertical direction, and bridges said interspace, independently of the spatial orientation of the electrode cage at the time when the test device is triggered.

This allows the electrochemical cell in which the test device is installed to be arranged in any desired orientation in space for the test. It goes without saying that the electrode cage can also have any other suitable configuration of partial electrodes with which this effect can be achieved.

If a carrier is used to fix the contact substance between the partial electrodes, then it is preferably produced from an electrically nonconductive material, for example a suitable plastic.

Particularly in the case where a material having a low melting point is used as contact substance or for fixing a contact substance, it is possible to alter the ambient temperature of the electrochemical cell in a targeted manner in order to trigger the switching device and to transfer it to the short-circuit state. For this purpose, by way of example, the electrochemical cell or the entire module in which the electrochemical cell is installed in test set-up is exposed to an increased ambient temperature above the melting point of the substance having a low melting point in a targeted manner. If this temperature is reached inside the test cell, then the switching device transitions to the short-circuit state and the electrochemical cell or the module can be tested under short-circuit conditions.

In order to enable the switching device also to be triggered independently of an increased ambient temperature, the switching device can, however, also comprise a heating device, which is in contact with the partial electrodes, in particular, and by means of which a temperature of the switching device can be increased in a targeted manner. By switching on the heating device, it is thus possible to actuate the switching device and to transfer the test device to the short-circuit state independently of the ambient temperature.

The heating device can be realized for example as a heating element through which current flows. In one variant, electric cables that feed current to the heating device are then led out of the electrochemical cell in which the test device is used and are energized externally.

In another variant, the heating device comprises an induction coil that is excited from outside the electrochemical cell. For this purpose, a radio-frequency field is advantageously used in order to increase the penetration depth and thus also to be able to check test cells inside a module and not just at the edge locations thereof. No external leads are required in this case. Moreover, the heat input into the electrochemical cell that is necessary for triggering the test device can be minimized.

The induction coil can be wound from multiple-stranded wire, for example.

It would also be conceivable to draw the current for the operation of the heating device from the electrochemical cell itself to be tested and, for this purpose, to provide an optionally radio-controlled switch in the electrical circuit of the heating device, which switch is closed in order to actuate the heating device.

Generally here, too, the switching device is triggered by action of heat, such that for example one of the electrode arrangements described above can be used.

As an alternative or in addition to the heating device at the switching device, in the test device a heating device separate from the switching device can be provided, by means of which a local temperature increase inside the electrochemical cell can be achieved. By way of example, a local temperature increase such as can precede a short circuit can be simulated by this heating device.

Moreover, it is thus possible, in the test cell, locally to cause an electrolyte to evaporate and thus to bring about a pressure increase in the cell. For this purpose, the separate heating device can advantageously be heated to at least 80° C.

As an alternative or in addition to the heating device(s), a device for releasing a chemical substance can also be provided, which is likewise arranged in the test device. However, this device for releasing a chemical substance can advantageously be coupled to the separate heating device and can trigger by virtue of the latter. By way of example, a liquid electrolyte or a solvent of an electrolyte can be evaporated in order for example to bring about a pressure increase inside the electrochemical cell or to simulate the evaporation of an electrolyte.

By way of example, EC (ethylene carbonate) or DMC (dimethyl carbonate) can be used as the chemical substance. These are customary electrolyte solutions in electrochemical cells. Other examples of substances whose use is conceivable are: dimethyl sulfoxide, diethyl carbonate, propylene carbonate, tetrahydrofuran, dioxane, diethyl ether, propyl acetate, water, ethanol, methanol, octane or hexadecane.

The chemical substance can be released before or at the same time as the switching device is transferred to the short-circuit state.

The invention also provides a module composed of an electrochemical cell and a test device, wherein a test device such as has been described above is useable. The test device is arranged in particular in a cover of the electrochemical cell within a housing of the electrochemical cell such that the switching device is in electrical contact with the two electrical electrodes of the electrochemical cell leading toward the outside. Consequently, in the short-circuit state, the entire current produced in the electrochemical cell flows via the switching device. The electrochemical cell is a lithium-ion rechargeable battery, in particular.

In this case, the electrochemical cell is preferably constructed according to the Swiss roll principle, in the case of which two electrodes initially lying one above the other are wound up into a roll. In a further preferred embodiment, the electrodes in the cell are stacked one above another and separated by separators.

In the simplest embodiment, the contact substance can be adhesively bonded fixedly to the cover above the partial electrodes of the switching device.

Triggering of the switching device can be effected as described above, in principle, by increasing the ambient temperature of the electrochemical cell or of the entire module in which the electrochemical cell is arranged.

The triggering temperature can be varied by the choice of the material of the contact substance.

In the case where a heating device as described above is used, the triggering is possible independently of the ambient temperature and the internal temperature of the electrochemical cell.

If the electrochemical cell consists of a cell stack constructed from individual subcells connected to one another, then the test device can be arranged inside the housing of the electrochemical cell such that the switching device is in electrical contact with two electrodes having different polarities of an individual subcell. In this case, therefore, the two main electrodes of the electrochemical cell that carry away current toward the outside are not short-circuited, rather a short circuit is brought about between the current-carrying electrodes of one of the subcells of the cell stack which altogether form the electrochemical cell. This allows an even more targeted, location-dependent test of the internal construction of the electrochemical cell.

The invention additionally relates to a method for testing an electrochemical cell, the method comprising the following steps:

a test device as described above is connected, inside the electrochemical cell, to two current-carrying electrodes of the electrochemical cell having different polarities such that in each case at least one partial electrode of the switching device is in direct electrical contact with one of the current-carrying electrodes, and the switching device is closed, wherein it is transferred from the initial state to the short-circuit state.

In this case, as described above the current-carrying electrodes can be the main electrodes of the cell that conduct away current toward the outside or electrodes of a subcell that are electrically connected to the main electrodes.

Apart from inserting the test device at the desired location within the electrochemical cell in order to prepare the latter, and optionally inserting the prepared electrochemical cell into a module with other electrochemical cells at the intended position, no preparations are required for the test.

In this case, the switching device is preferably closed by the action of heat, such that it is possible to dispense with mechanically moving parts except for e.g. the contact substance moved by gravity. The action of heat can be effected here in the simplest case by increasing the ambient temperature of the prepared electrochemical cell or in a targeted manner by switching on a heating device that locally heats the switching device.

In this regard, at the desired temperature or at the desired point in time, the switching device can be transferred to the short-circuit state, and the prepared cell is subjected to a short circuit brought about artificially.

Optionally, by way of the additional heating device in the prepared cell locally within the electrochemical cell the temperature can be increased in order to create an additional test condition.

Alternatively or additionally, optionally a gas can be released in the cell in order to simulate a pressure increase in the cell for example by the evaporation of an electrolyte and to test the cell under this condition.

If the electrochemical cell is inserted into a module with a multiplicity of other electrochemical cells, then these other electrochemical cells normally do not have a test device.

The invention is described in greater detail below on the basis of a plurality of exemplary embodiments and with reference to the accompanying drawings.

DETAILED DESCRIPTION OF THE DRAWINGS

Figure 1:
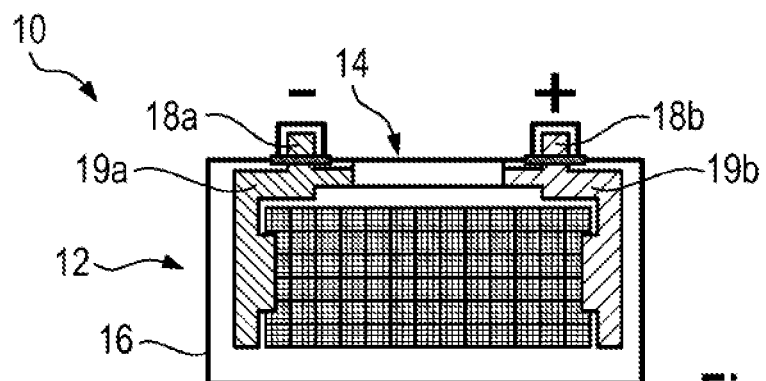
FIG. 1 shows a schematic sectional view of a module according to an embodiment of the invention comprising an electrochemical cell, into which a test device according to an embodiment of the invention is inserted, for carrying out a method.
Figure 2:
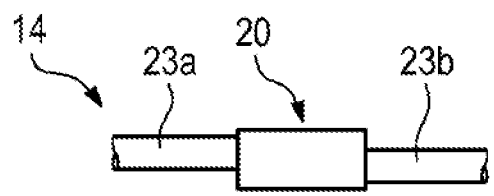
FIG. 2 shows a schematic illustration of a switching device of a test device.

FIG. 1 shows a module 10 composed of an electrochemical cell 12, in particular a lithium-ion rechargeable battery, and a test device 14, which is inserted inside the electrochemical cell 12.

The electrochemical cell 12 comprises an outer housing 16, which closes off the cell 12 outwardly with respect to the surroundings. Two electrodes 18a, 18b having different polarities (also referred to hereinafter as cathode 18a and anode 18b, respectively) lead out of the housing 16, which electrodes constitute the main electrodes of the electrochemical cell 12 and via which electrodes the current generated in the electrochemical cell 12 is emitted toward the outside.

In the example illustrated, the test device 14 is electrically connected to the two electrodes 18a, 18b inside the electrochemical cell 12.

Inside the electrochemical cell 12 the electrodes 18a, 18b are connected to an internal set-up embodied in a known manner and not illustrated in more specific detail, said internal set-up containing current-generating electrodes in contact with an electrolyte, suitable separating means and further components.

In the case of a lithium-ion rechargeable battery, the cathode 18a is connected to a current collector 19a of the internal set-up composed of copper and the anode 18b is connected to a current collector 19b composed of aluminum, which in turn contact the current-generating electrodes of the internal set-up of the electrochemical cell 12.

The internal set-up can be embodied according to the principle of the so-called "jelly roll", in the case of which rolled-up electrodes of opposite polarities lying one above another are used. Alternatively, the internal set-up can also be fashioned as a cell stack having a multiplicity of interconnected subcells which are arranged next to one another and which each have dedicated current-carrying electrodes 40a, 40b (see FIGS. 12 to 14). In principle, in both cases the test device 14 can be inserted in the same way between the electrodes 18a, 18b or the electrodes 40a, 40b.

The test device 14 comprises a switching device 20 comprising at least one cathodic partial electrode 22a and at least one anodic partial electrode 22b.

The test device 14 is inserted into the electrochemical cell 12 such that all cathodic partial electrodes 22a present in the switching device 20 are connected, in a highly electrically conductive manner, directly to the cathode 18a by way of a first connecting cable 23a and all anodic partial electrodes 22b present are connected, in a highly electrically conductive manner, directly to the anode 18b by way of a second connecting cable 23b.

If the test device 14 is inserted into a subcell, the connecting cables 23a, 23b are instead directly connected correspondingly to the electrodes 40a, 40b.

The partial electrodes 22a, 22b and also the connecting cables 23a, 23b here consist of the respective metal also comprised by the electrodes 18a, 18b and 40a, 40b, respectively, to which they are electrically connected, that is to say copper and aluminum, for example.

Figure 3:
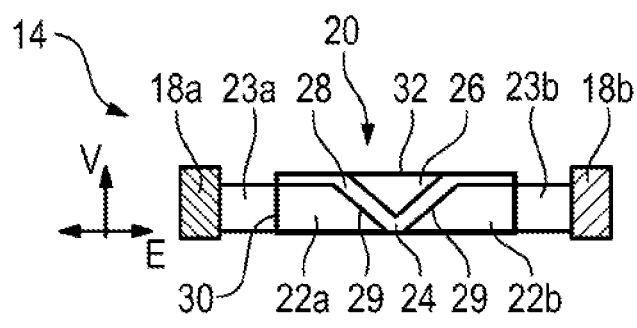
FIG. 3 shows a switching device of a test device in accordance with a first embodiment in an initial state.
Figure 4:
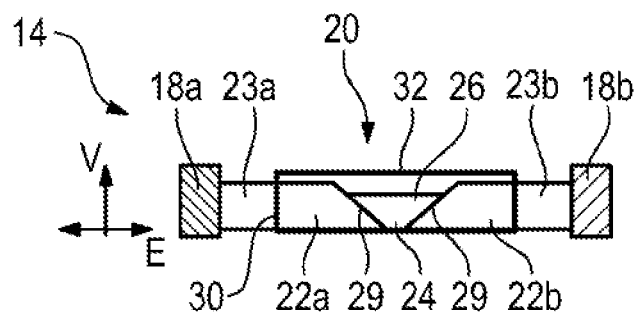
FIG. 4 shows the switching device from FIG. 3, closed in a short-circuit state.

FIGS. 3 and 4 show the switching device 20 in a first embodiment, and FIGS. 5 to 9 show the switching device 20 in a second embodiment.

In the embodiment illustrated in FIGS. 3 and 4, exactly two partial electrodes 22a, 22b are provided, which are spaced apart from one another by an interspace 24. The interspace 24 electrically insulates the two partial electrodes 22a, 22b from one another and is air-filled, for example.

FIGS. 3 and 4 show the switching device 20 in its predefined installation position. The two partial electrodes 22a, 22b are positioned in a common plane E oriented horizontally, in which the interspace 24 is also situated. Toward the interspace 24 the partial electrodes 22a, 22b are beveled in the vertical direction V and have oblique surfaces 29 inclined toward the interspace 24.

In an initial state of the test device 14, a contact substance 26 is arranged above the interspace 24 in the vertical direction V and is spaced apart from at least one of the partial electrodes 22a, 22b by a gap 28. In this state, no current flows through the switching device 20; the ohmic resistance thereof is determined by the interspace 24.

The test device 14 has a housing 30 surrounding the partial electrodes 22a, 22b and the contact substance 26. The interspace 24 is bounded at the bottom in a liquid-tight manner by the housing 30.

The connecting cables 23a, 23b are led out of the housing 30, such that they can be electrically conductively connected to the cathode 18a and the anode 18b, respectively.

In the initial state, the contact substance 26 is fixed, for example adhesively bonded fixedly, on the inside to a top side 32 of the housing 30.

It would also be conceivable to fix the contact substance 26 directly to an inner side of a cover of the housing 16 of the electrochemical cell 12. In this case, too, it is necessary, however, for the interspace 24 to be bounded in a liquid-tight manner toward the bottom.

In the exemplary embodiments described here, the contact substance 26 consists in each case of a material having a low melting point of, for instance, between 50 and 100° C. In the initial state, the contact substance is in the solid state of matter.

In this case, by way of example, it is possible to use suitable bismuth alloys having a bismuth content of at least 30 percent by weight. Suitable alloys are mentioned by way of example in the table presented below. The quantitative information is in percent by weight.

|  | Melting point | Eutectic mixture | Bismuth | Lead | Tin | Indium | Cadmium |
|---|---|---|---|---|---|---|---|
| Cerrolow 136 | 58° C. | yes | 49 | 18 | 12 | 21 | — |
| Wood's metal | 70° C. | yes | 50 | 26.7 | 13.3 | — | 10 |
| Field's metal | 62° C. | yes | 32.5 | — | 16.5 | 51 | — |
| Rose's metal | 94° C. | no | 50 | 25 | 25 | — | — |
| Cerrosafe | 74° C. | no | 42.5 | 37.7 | 11.3 | — | 8.5 |

If the test device 14 is activated, the switching device 20 being closed, then as a result of a temperature increase the contact substance 26, still solid in the initial state, is heated and transferred to the liquid state of matter.

On account of the liquefaction, the contact substance 26 is released from being secured e.g. to a carrier and crosses the gap 28 under the influence of gravity. The oblique surfaces 29 guide the liquid contact substance 26 into the interspace 24 between the two partial electrodes 22a, 22b. The contact substance 26 fills the interspace 24 to an extent such that it bridges the interspace 24 and electrically conductively connects the two partial electrodes 22a, 22b to one another. This is the short-circuit state of the test device 14.

Since the two partial electrodes 22a, 22b are electrically conductively connected to the main electrodes 18a, 18b of the electrochemical cell 12, a short-circuit current then flows between the cathode 18a and the anode 18b, and the electrochemical cell 12 is short-circuited.

The contact substance 26 has to be provided, of course, in a sufficient amount to sufficiently fill the interspace 24 and to produce a good electrical contact with the partial electrodes 22a, 22b. The ohmic resistance of the switching device 20 is then substantially determined by the resistance of the partial electrodes 22a, 22b and the contact substance 26 and is generally so low that the entire short-circuit current of the electrochemical cell 12 can flow through the switching device 20 for a time duration sufficient for the test measurement, without destroying said switching device.

In the test set-up, it is then possible to check the behavior of the electrochemical cell 12 or else the entire module in which the prepared electrochemical cell 12 is incorporated.

FIGS. 5 to 9 show a second embodiment of the switching device 20 of the test device 14.

In this embodiment, the switching device 20 has an electrode cage 34, which is composed of a plurality of cathodic and anodic partial electrodes 22a, 22b arranged such that a cathodic partial electrode 22a is respectively adjacent to an anodic partial electrode 22b, and wherein all the partial electrodes 22a, 22b are spaced apart from one another in each case by an interspace 24.

The partial electrodes 22a, 22b are arranged in space such that independently of the spatial orientation of the electrode cage 34, at a lower end of the electrode cage 34 in the vertical direction V, a cathodic partial electrode 22a is positioned adjacent to an anodic partial electrode 22b, separated by an interspace 24.

In this example, the contact substance 26 is arranged in the center of the electrode cage 34 in the initial state. It is held there by a carrier 35, for example, as long as the contact substance 26 is in its solid state of matter.

Figure 6:
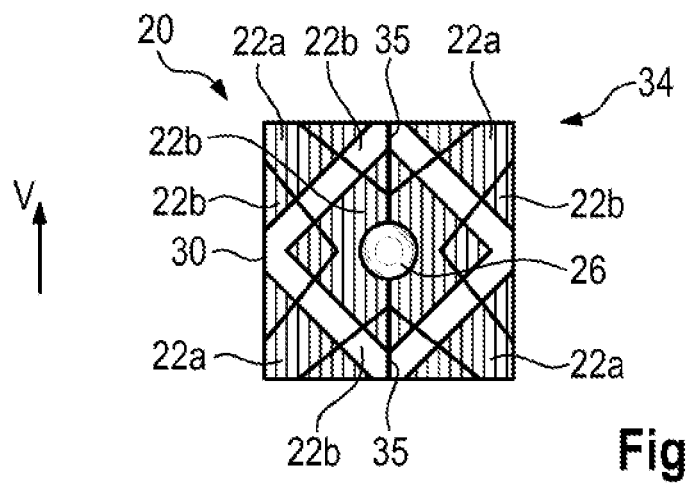
FIG. 6 shows a schematic illustration of the electrode cage from FIG. 5 in a front view.
Figure 7:
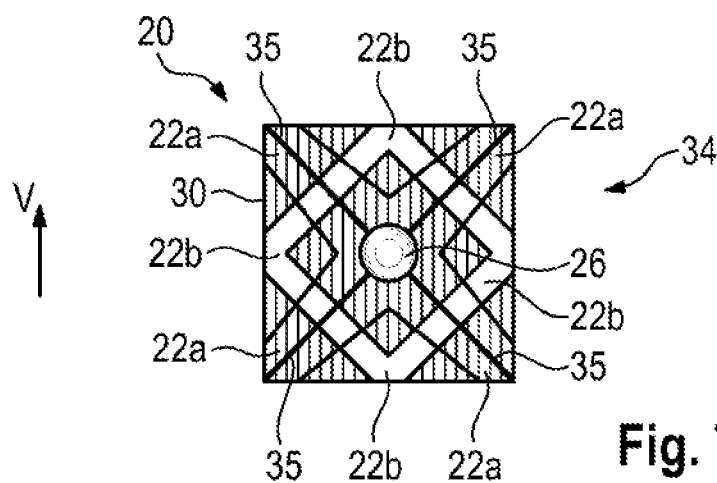
FIG. 7 shows a schematic illustration of the electrode cage from FIG. 5 in a side view.

In FIGS. 6 and 7, the carrier 35 is realized in the form of wires stretched diagonally through the center of the electrode cage 34. Any other suitable means could also be used, of course, to keep the contact substance 26 at a distance from the interspaces 24 when it is in its solid state of matter. The carrier 35 here consists of an electrically nonconductive material.

The outer surface of the electrode cage 34 is cubic. The partial electrodes 22a are arranged in all the corners of the cube and are tetrahedral in the example shown here, wherein one of the tetrahedron faces forms an oblique surface 29 truncating the respective corner.

A respective partial electrode 22b is positioned in the center of each of the side faces of the cube. The partial electrodes 22b here are fashioned such that they are pyramidal or conical and project into the interior of the electrode cage 34. Oblique surfaces 29 are thus formed at the partial electrodes 22b as well. As in the first embodiment, the oblique surfaces 29 of two adjacent partial electrodes 22a, 22b having different polarities are inclined in each case toward the interspace 24 situated between the partial electrodes 22a, 22b.

Between the partial electrodes 22a, 22b there is in each case an interspace 24. The housing 30 surrounds the electrode cage 34 in such a way that all the interspaces 24 are bounded in a liquid-tight manner by the housing 30 and the partial electrodes 22a, 22b that are currently situated at the bottom in the vertical direction V.

Figure 5:
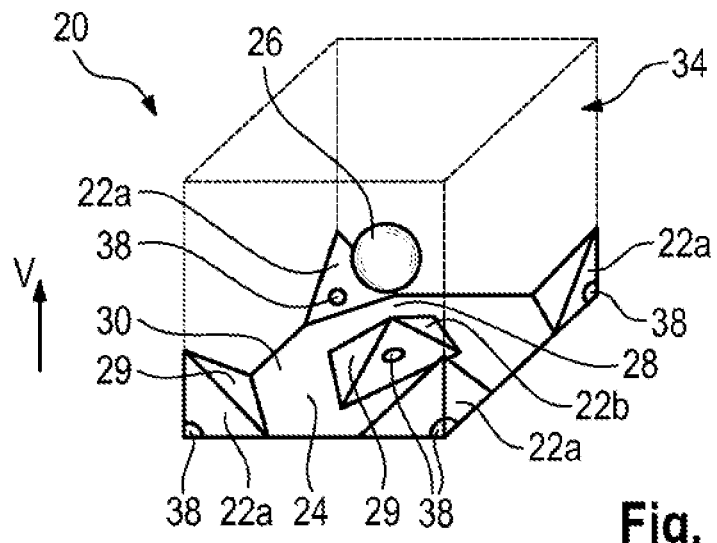
FIG. 5 shows a schematic perspective illustration of an electrode cage of a switching device of a test device in accordance with a second embodiment.

FIG. 5 shows the arrangement of the partial electrodes 22a, 22b for one side face of the electrode cage 34. The other five sides of the electrode cage are embodied analogously, but not illustrated for reasons of clarity.

In the center of the electrode cage 34, the contact substance 26 is suspended from the carrier 35, such that it is spaced apart from all the partial electrodes 22a, 22b by a gap 28. In one particular embodiment, an induction-based resistance, for example a multiple-stranded wire or an RFID-based resistance circuit, can be used for the carrier 35.

In the event of the test device 14 being triggered, the contact substance 26 changes its state of matter and becomes liquid and then drips downward in the vertical direction V onto the side face currently forming the bottom of the electrode cage 34.

By means of the oblique surfaces 29 of the partial electrode 22b directly below the contact substance 26, the liquefied contact substance 26 is guided into one or more of the interspaces 24 between the partial electrode 22b and the four partial electrodes 22a in the corners of the bottom face and fills one or more of the interspaces 24 to an extent such that the latter are bridged and the electrical contact between the partial electrodes 22a, 22b is closed. The mode of action is thus the same as in the first embodiment.

On account of the identical construction of all the side faces of the electrode cage 34, the switching device 20 in this embodiment can be used in different orientations, irrespective of which side face of the electrode cage 34 presently forms the bottom face thereof.

It is also possible to choose the quantity of contact substance 26 with a magnitude such that a short circuit is ensured by one of the interspaces 24 being filled even if the electrode cage 34 is at an inclination of up to 45°.

The electrochemical cell 12 in which the test device 14 is incorporated can therefore be tested in an arbitrary position in space.

It goes without saying that, with the same function, the partial electrodes 22b could also be arranged in the corners and the partial electrodes 22a could also be arranged in the center of the side faces.

For the electrical contacting of the partial electrodes 22a, 22b, in this example electrically conductive electrode connectors 36a, 36b are provided, which respectively electrically connect all partial electrodes 22a, 22b of a single polarity to one another. The electrode connectors 36a, 36b here are produced from the material of the respective partial electrodes 22a, 22b. Each of the electrode connectors 36a, 36b is connected to the respective connecting cable 23a, 23b (see FIGS. 8 and 9).

The electrode connectors 36a, 36b run on the outer side of the housing 30 and are insulated from the interior of the electrode cage 34 by said housing.

Figure 8:
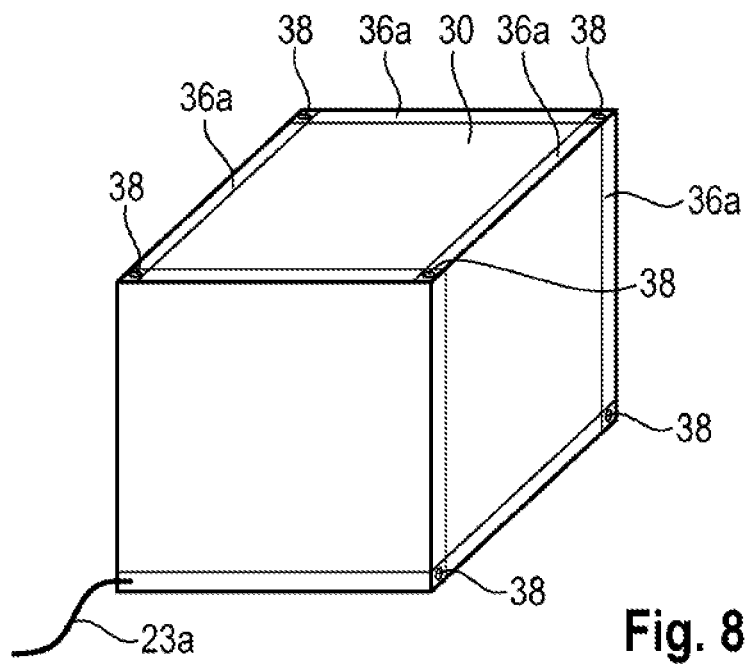
FIGS. 8 and 9 show schematic illustrations of electrode connections of the electrode cage from FIG. 5.

In the example illustrated here, the electrode connectors 36a run along some or all of the edges of the housing 30 of the electrode cage 34 and connect all of the partial electrodes 22a (see FIG. 8).

Figure 9:
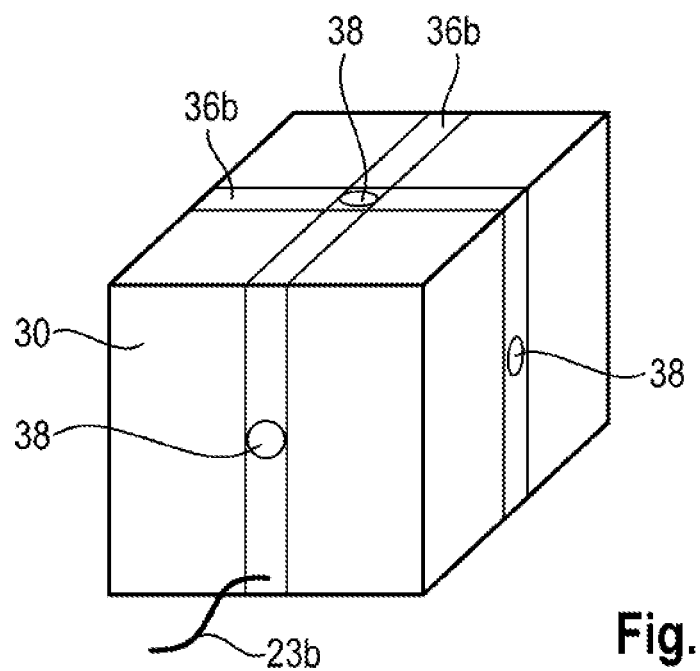

By contrast, the electrode connectors 36b run between the corners of the electrode cage 34 over the side faces, parallel to the edges, and connect all of the partial electrodes 22b (see FIG. 9).

In order that the electrode connectors 36a, 36b are electrically insulated from one another, an electrically insulating film is provided between them (not illustrated).

In the region of the partial electrodes 22a, 22b, a respective contact point 38 is provided, at which the housing 30 is perforated and an electrically conductive connection to exactly the underlying partial electrode 22a, 22b is formed. This is illustrated in FIGS. 5, 8 and 9.

The electrode cage 34 shown here is chosen by way of example. It is possible, of course, to use any suitable geometric arrangement of partial electrodes 22a, 22b which is able to achieve the described effect that an interspace 24 between two partial electrodes 22a, 22b having different polarities in different orientations of the switching device 20 is closed upon activation of the test device 14.

One possible option for triggering the test device 14 and for closing the switching device 20 is to increase the ambient temperature of the electrochemical cell 12 to a value at which the melting point of the contact substance 26 is reached.

The ambient temperature at which the test device 14 is triggered can be set within certain bounds by means of a suitable choice of the melting point.

Figure 10:
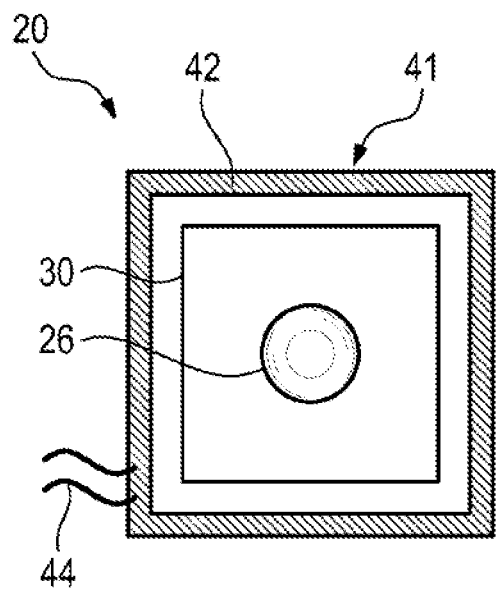
FIG. 10 shows a schematic sectional view of a test device, wherein the switching device comprises a heating device and the heating device is embodied as a heating resistor.
Figure 11:
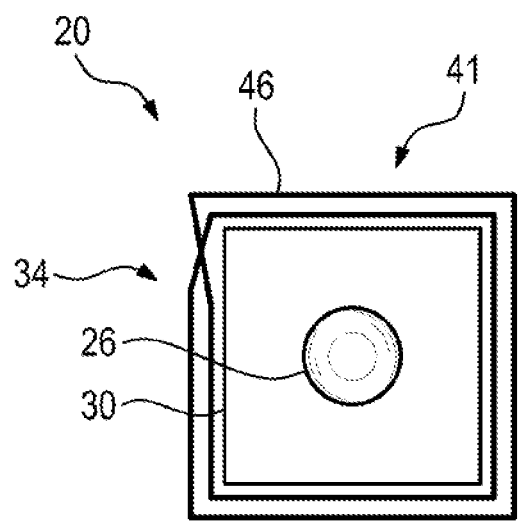
FIG. 11 shows a schematic sectional view of a test device, wherein the switching device comprises a heating device and the heating device is embodied as an induction coil.

Another option is illustrated in FIGS. 10 and 11. In this case, an active heating device 41 is provided, which can heat the contact substance 26 above the melting point thereof. By way of example, the heating device 41 is arranged such that it peripherally surrounds the partial electrodes 22a, 22b and the contact substance 26.

By means of the heating device 41 being switched on in a targeted manner, the temperature of the switching device 20 can thus be increased locally to an extent such that the melting point of the contact substance 26 is exceeded. This results, as described above, in the melting of the contact substance 26, such that the latter fills one of the interspaces 24 between two partial electrodes 22a, 22b and brings about the short-circuit state.

In the case of FIG. 10, the heating device 41 is embodied as an electrical heating wire 42 or some other heating resistor wrapped around the housing 30 and the electrode cage 34. The heating wire 42 has leads 44 that are led out of the electrochemical cell 12. By applying an electric current, it is thus possible to switch on the heating device 41 from outside the electrochemical cell 12 in order to trigger the test device 14 independently of the ambient temperature of the electrochemical cell 12.

In the case of FIG. 11, the heating device 41 is embodied as an induction coil 46, which can be supplied with energy by way of a radio-frequency field in order to heat the contact substance 26 with only very little heat input into the switching device 20. No external cabling is required in this case. The frequency of the induction coil and also the field strength of the radio-frequency field should be chosen here, of course, so as to achieve a sufficient current flow for the desired temperature increase.

By way of example, a multiple-stranded wire or an RFID-based resistance circuit can be used as the induction coil.

All described ways of triggering the switching device 20 are combinable, of course, with all described embodiments of the switching device 20.

In all the embodiments described here, the switching device 20 is closed by the action of heat. It goes without saying, however, that it would alternatively also be possible to close the switching device 20 in a different way, for example mechanically. It is also conceivable only to use a trigger which is triggered by the action of heat and which then actuates a mechanical device, for example a spring mechanism, in order to move the contact substance 26 into the interspace 24. In this case, by way of example, the trigger could comprise a material having a low melting point, while the contact substance 26 consists of a material which is electrically conductive but has a higher melting point and thus remains in the solid state of matter even in the short-circuit state.

Figure 12:
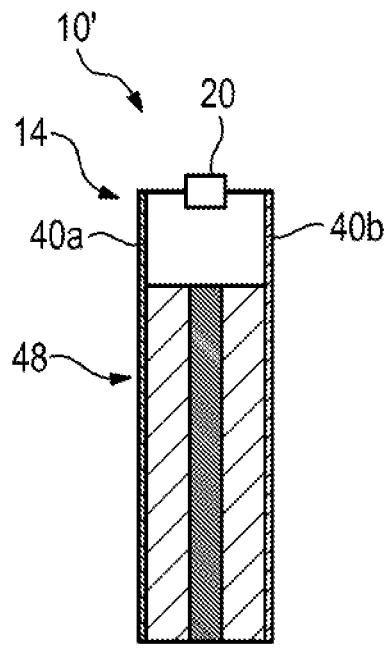
FIG. 12 shows a schematic sectional view of a module composed of a subcell of a cell stack of the electrochemical cell with a test device.

FIG. 12 shows a module 10' in which the test device 14 is not arranged between the main electrodes of the electrochemical cell 12, but rather at inner electrodes 40a, 40b of a subcell 48 of a stack (not illustrated) of subcells 48.

The use and the mode of action of the test device 14 are identical to the embodiment described above, the electrodes 40a, 40b being used instead of the electrodes 18a, 18b. Since the test device 14 is arranged only in a single subcell 48 in this example, a very accurately localized short circuit can be produced.

By way of example, one of the devices described above is used as the switching device 20.

The functioning is identical to that described above, with the exception that when the switching device 20 is triggered, only the prepared subcell 48 is short-circuited, rather than the entire electrochemical cell 12.

Figure 13:
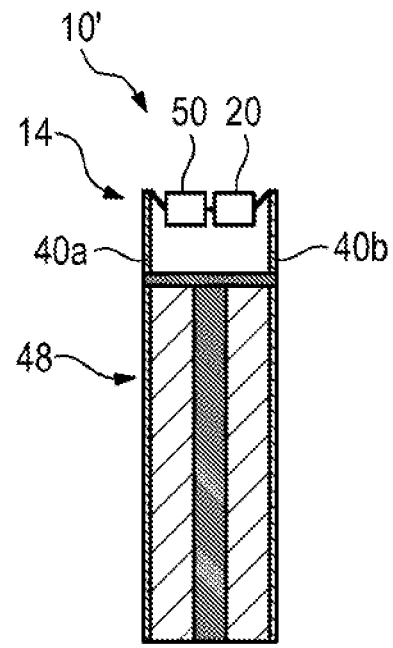
FIG. 13 shows the module from FIG. 12 with a test device with an additional heating device, separate from the switching device.

FIG. 13 shows a variant of the module 10' from FIG. 12, in which the test device 14 has a separate heating device 50 in addition to the switching device 20, by means of which heating device it is possible to achieve a local temperature increase in the interior of the electrochemical cell 12, for example of above 80° C.

In this regard, it is possible to create a further test condition involving the simulation of a local temperature increase that can occur in the case of a defect. In this case, the evolution of heat that is achievable by means of the separate heating device 50 is chosen to be high enough that an electrolyte inside the subcell 48 or the electrochemical cell 12 can evaporate, which results, inter alia, in a pressure increase inside the electrochemical cell 12.

The heating device 48 can be realized by a resistance heating element, for example. Of course, inductive heating would be possible here as well.

Figure 14:
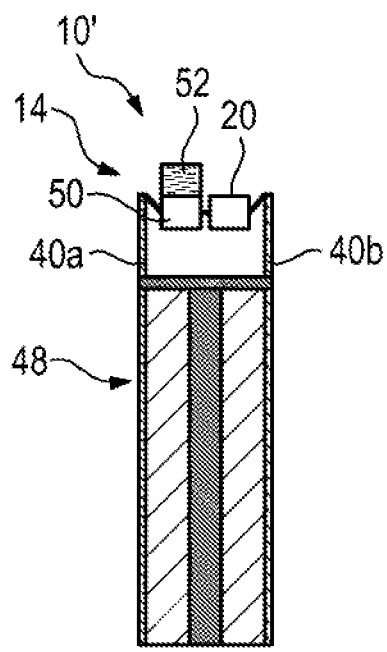
FIG. 14 shows the module from FIG. 13 with a test device with an additional device for releasing a chemical substance.

FIG. 14 shows a further variant involving the provision of a device 52 that serves for releasing a chemical substance. The chemical substance can be, for example, a suitable gas, an electrolyte or a solvent of an electrolyte, for example ethylene carbonate (EC) or dimethyl carbonate (DMC). Further suitable substances are e.g.: dimethyl sulfoxide, diethyl carbonate, propylene carbonate, tetrahydrofuran, dioxane, diethyl ether, propyl acetate, water, ethanol, methanol, octane or hexadecane.

In the example shown in FIG. 14, the device 52 is coupled to the separate heating device 50, such that when the heating device 50 is switched on, the heat generated heats up a supply of liquid in the device 52 and causes it to evaporate, whereupon the chemical substance in the gaseous state can escape from the device 52 into the interior of the electrochemical cell 12.

Of course, the device 52 could also be used separately from the heating device 50 and independently of the latter. Any suitable known trigger mechanism can be used for releasing the chemical substance.

In FIGS. 13 and 14, the separate heating device 50 and respectively the device 52 for releasing a chemical substance are illustrated as connected in series with the switching device 20. A parallel connection would also be possible in order to reduce the electrical resistance.

It should be taken into consideration here that with the use of an external power supply, the heating device 50 and the device 52 need not at all be arranged in an electrical circuit that includes the electrodes 18a, 18b or 40a, 40b of the electrochemical cell 12.

The separate heating device 50 and the device 52 for releasing a chemical substance can also be used, of course, if the test device 14 is arranged between the main electrodes 18a, 18b of the electrochemical cell 12.

What is claimed is:

1. A test device for arrangement inside an electrochemical cell, comprising:
   a switching device electrically connected to two current-carrying electrodes of the electrochemical cell having different polarities, wherein
   the switching device has a cathodic and an anodic partial electrode arranged adjacently, but with an interspace,
   the switching device is open in an initial state, such that no electric current flows between the partial electrodes,
   the switching device is closed in a short-circuit state in which the interspace between the partial electrodes is bridged, such that an electric current flows between the current-carrying electrodes of the electrochemical cell and through the partial electrodes,
   the switching device comprises an electrically conductive contact substance, which is kept at a distance from at least one of the partial electrodes by a gap in the initial state, and
   the contact substance is arranged such that upon transition to the short-circuit state, under influence of gravity, the substance passes into the interspace between two adjacent partial electrodes and bridges said interspace thus closing the switching device.

2. The test device according to claim 1, wherein
   the contact substance is made of a material which is in a solid state of matter in the initial state and in a liquid state of matter in the short-circuit state, and
   the contact substance has a melting point of 50-100° C.

3. The test device according to claim 2, wherein
   the contact substance is an alloy containing at least 30% bismuth and at least one of:
   lead, tin, indium and cadmium.

4. The test device according to claim 1, wherein the switching device further comprises:
   the at least one cathodic and the at least one anodic partial electrode which are arranged next to one another in a horizontally oriented plane and are separated by an interspace, and
   the contact substance in the initial state is positioned above the partial electrodes.

5. The test device according to claim 1, wherein
   the partial electrodes of the switching device form an electrode cage and the contact substance in the initial state is positioned within the electrode cage, and
   the electrode cage is embodied such that independently of an orientation in space, upon transition to the short-circuit state, the contact substance passes into the interspace between a cathodic and an anodic partial electrode and bridges said interspace.

6. The test device according to claim 1, wherein the switching device further comprises:
   a heater which is in contact with the partial electrodes and by which a temperature of the switching device is increased in a targeted manner.

7. The test device according to claim 6, wherein
   the heater comprises an induction coil.

8. The test device according to claim 1, further comprising:
   a heater separate from the switching device, by which a local temperature increase inside the electrochemical cell is achieved.

9. The test device according to claim 1, further comprising:
   means for releasing a chemical substance.

10. A module, comprising:
    an electrochemical cell; and
    a test device according to claim 1, wherein
    the test device is arranged in a cover of the electrochemical cell within a housing of the electrochemical cell such that the switching device is in electrical contact with the two electrical electrodes of the electrochemical cell leading toward the outside.

11. A module, comprising:
    an electrochemical cell; and
    a test device according to claim 1, wherein
    the test device is arranged inside a housing of the electrochemical cell, and the switching device is in electrical contact with two electrodes having different polarities of an individual subcell of a cell stack inside the electrochemical cell.

12. A method for testing an electrochemical cell, comprising:
connecting a test device inside the electrochemical cell to two current-carrying electrodes of the electrochemical cell having different polarities, wherein
the test device comprises a switching device electrically connected to the two current-carrying electrodes of the electrochemical cell having different polarities,
the switching device has a cathodic and an anodic partial electrode arranged adjacently, but with an interspace,
the switching device is open in an initial state, such that no electric current flows between the partial electrodes,
the switching device is closed in a short-circuit state in which the interspace between the partial electrodes is bridged, such that an electric current flows between the current-carrying electrodes of the electrochemical cell and through the partial electrodes,
the switching device comprises an electrically conductive contact substance, which is kept at a distance from at least one of the partial electrodes by a gap in the initial state, and
the contact substance is arranged such that upon transition to the short-circuit state, under influence of gravity, the substance passes into the interspace between two adjacent partial electrodes and bridges said interspace thus closing the switching device,
in each case at least one partial electrode of the switching device is in direct electrical contact with one of the current-carrying electrodes; and
closing the switching device, wherein the switching device is transferred from the initial state to the short-circuit state.

13. The method according to claim 12, wherein the switching device is closed by action of heat.

* * * * *